(12) United States Patent
Lee et al.

(10) Patent No.: US 7,031,858 B1
(45) Date of Patent: Apr. 18, 2006

(54) METHOD AND CIRCUIT FOR DC MEASUREMENT OF PHASE UNIFORMITY OF MULTI-PHASE CLOCKS

(75) Inventors: Eric Lee, San Jose, CA (US); Gyudong Kim, Sunnyvale, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 153 days.

(21) Appl. No.: 10/439,446

(22) Filed: May 16, 2003

(51) Int. Cl.
*G01R 13/00* (2006.01)

(52) U.S. Cl. .............................. 702/72; 702/71; 702/79

(58) Field of Classification Search ................. 702/72, 702/71, 79; 327/161, 163, 165, 166, 167; 331/1 A; 342/357.03; 356/73.1; 375/354, 375/355, 371, 373, 376
See application file for complete search history.

(56) References Cited

U.S. PATENT DOCUMENTS 6,812,777 B1 * 11/2004 Tamura et al. .............. 327/540

2002/0154723 A1 * 10/2002 Nakamura ................... 375/376
2003/0142773 A1 * 7/2003 Shirota et al. .............. 375/373

* cited by examiner

*Primary Examiner*—John Barlow
*Assistant Examiner*—Stephen J. Cherry
(74) *Attorney, Agent, or Firm*—Girard & Equitz LLP

(57) ABSTRACT

Methods and circuits for measuring clock phase uniformity of multi-phase clock set, including by generating at least one DC phase difference signal such that the DC phase difference signal is, or the DC phase difference signals are, indicative of the phase difference between the clocks of each of multiple pairs of clocks of the clock set, and methods and circuitry for generating such DC phase difference signals. Preferably, multiplexer circuitry asserts to DC signal generation circuitry any selected one of a number of pairs of clocks of the clock set, and the DC signal generation circuitry includes logic (for generating a binary signal in response to each clock pair) and a low pass filter for generating a DC phase difference signal in response to the binary signal. Other aspects are receivers and transmitters that include circuitry for generating at least one DC phase difference signal, and systems including at least one such transmitter (or receiver) and a link (e.g., a multi-channel or single-channel serial link) coupled thereto.

49 Claims, 3 Drawing Sheets

METHOD AND CIRCUIT FOR DC MEASUREMENT OF PHASE UNIFORMITY OF MULTI-PHASE CLOCKS

FIELD OF THE INVENTION

The invention pertains to methods and circuitry for measuring and/or testing the phase uniformity of a multi-phase clock set (e.g., a multi-phase clock set employed for transmitting or receiving data over a serial link). Embodiments of the invention can be employed to test the phase uniformity of multi-phase delayed versions of a clock (and the clock itself), where each delayed version of the clock has a different phase.

BACKGROUND OF THE INVENTION

A multi-phase clock scheme relieves clock speed requirements in circuits that require high speed clocking. In a typical multi-phase clock scheme, delayed versions of a clock (e.g., a video clock employed for transmitting video data over a serial link) are generated (each delayed version of the clock having a different phase) and the delayed versions are employed with the clock itself.

The expression "multi-phase clock set" is used herein to denote a set of L clocks, each having frequency $f_{dck}$ and each having a different phase $\phi_m$ that satisfies $\phi_m = \phi_{offset} + 2\pi(m/L) + \Delta_m$ where the index "m" is a non-negative integer in the range $\{0, \ldots, L-1\}$, and $\Delta\phi_m$ is an error term. Typically $\Delta\phi_m$ is much smaller than the phase increment $2\pi/L$, and a multi-phase clock set is generated to approximate (as closely as is practical) an ideal multi-phase clock set consisting of L clocks, each having frequency $f_{dck}$ and each having a different phase $\phi_m = \phi_{offset} + 2\pi(m/L)$. In typical applications, a multi-phase clock set is generated in response to a principal clock having frequency $f_{dck}$ and phase $\phi_{offset}$ (in other typical applications, the principal clock has frequency other than $f_{dck}$). Typically, a transmitter uses a multi-phase clock set to transmit (to a receiver) data (having a data rate greater than the frequency $f_{dck}$) together with one clock of the multi-phase clock set (or another clock). The receiver generates a second multi-phase clock set in response to the received clock, and recovers the data using the second multi-phase clock set.

For example, in systems implementing the conventional Digital Video Interface ("DVI link") adopted by the Digital Display Working Group, a video clock having frequency $f_{vclk}$ is generated and transmitted over a serial link to a receiver. Both the transmitter and receiver include circuitry for generating a multi-phase clock set in response to the video clock. One multi-phase clock set is employed in the transmitter to transmit data with a data rate greater than the video clock frequency $f_{vclk}$; the other multi-phase clock set is employed by the receiver to recover the data.

Typically, the phase differences between different pairs of clocks of a multi-phase clock set differ from clock pair to clock pair. Specifically, the phase difference between any two of the clocks satisfies $\phi_m - \phi_n = 2\pi(m-n)/L + \Delta\phi_{mn}$, where m·n, and the error term $\Delta\phi_{mn}$ typically differs from clock pair to clock pair. If N pairs of clock pairs are considered, the quantity (m–n) has the same predetermined value for all clock pairs, and N error term differences $(\Delta\phi_{mn})_i - (\Delta\phi_{mn})_j = (\phi_m - \phi_n)_i - (\phi_m - \phi_n)_j$ are measured, where each index i identifies one of the clock pairs and each index j identifies another of the clock pairs, then the error term differences $(\Delta\phi_{mn})_i - (\Delta\phi_{mn})_j$ over all (or some) of the pairs of clock pairs provide a measure of the uniformity of the clock phases of the multi-phase clock set. For example, the sum (or average) of the absolute values of the error term differences $(\Delta\phi_{mn})_i - (\Delta\phi_{mn})_j$ over all (or some) of the pairs of clock pairs is one indication of the uniformity of the clock phases of the multi-phase clock set, and the difference between the largest and the smallest of the error term differences $(\Delta\phi_{mn})_i - (\Delta\phi_{mn})_j$ is another indication of the uniformity of the clock phases of the multi-phase clock set.

The uniformity of the phases of the clocks of a multi-phase clock set becomes critical as the data rate increases (and can be significant even at low data rates). However, measuring the clock phase uniformity in the time domain requires a very high-speed measurement for serial links when the data rate is high (i.e., when the clock frequency is high and/or the ideal phase difference between clocks is small). Thus, it is typically not feasible for automatic test equipment (ATE) to measure clock phase uniformity in the time domain.

SUMMARY OF THE INVENTION

In a class of embodiments, the invention is a method and circuit (or system) for measuring clock phase uniformity of multi-phase clock set, including by generating at least one DC signal (referred to herein as a DC phase difference signal) such that the DC phase difference signal is (or the DC phase difference signals are) indicative of the phase difference between the clocks of each of at least two pairs of clocks of the clock set. Other aspects of the invention are methods and circuitry for generating such DC phase difference signals.

In preferred embodiments, the inventive circuit (or system) includes DC signal generation circuitry configured to generate a DC phase difference signal in response to a sequence of pairs of clocks (of a multi-phase clock set) asserted thereto. Preferably, the circuit (or system) also includes multiplexer circuitry configured to assert to the DC signal generation circuitry any selected one of a number of pairs of clocks (of the multi-phase clock set). Preferably, the DC signal generation circuitry includes combinational logic for generating a binary signal in response to each selected clock pair, and a low pass filter for generating a DC phase difference signal indicative of the level of the binary signal averaged over a time interval (having duration not less than one clock period, and preferably having duration much longer than one clock period). The binary signal's level (at each instant during assertion of a selected clock pair) is $Q=k(C1+(\sim C2))$, where "+" denotes a logical "AND" operation, "C1" and "C2," respectively, are the levels of the clocks of the selected clock pair, "~C2" denotes the complement of C2, and "k" is a fixed value. In typical embodiments, the low pass filter is a simple RC circuit. Typically, a sequence of clock pairs is asserted to the DC signal generation circuitry (each clock pair for a time interval T), and the DC phase difference signal is a voltage whose level is sampled at the end of each time interval to provide an indication of the phase difference between each clock pair.

The embodiments described in the previous paragraph, and variations thereon which implement logically equivalent functions (e.g., embodiments in which the binary signal is an inverted version of the binary signal described in the previous paragraph), are preferred for measuring clock phase uniformity of multi-phase clock set in a receiver (or other device) in which the timing from rising edge to rising edge of each clock is the primary concern. In other applications (e.g., for measuring clock phase uniformity of multi-phase clock set in a typical transmitter), the timing between the rising edge of one clock and the falling edge of another clock (e.g., the timing between the falling edge of clock1 and the rising edge of clock3 which has duration equal to about one serial bit width) may be the primary concern. In each application, the combinational logic should generate a binary signal in response to each selected clock pair in an appropriate manner (e.g., when the timing between the rising edge of one clock and the falling edge of another clock is the primary concern, the binary signal's level at each instant during assertion of a selected clock pair can be Q=k(C1+C2), where "+" denotes a logical "AND" operation, "C1" and "C2," respectively, are the levels of the clocks of the selected clock pair, and "k" is a fixed value).

Other aspects of the invention are a receiver that includes any embodiment of the inventive DC signal generation circuitry, a transmitter that includes any embodiment of the inventive DC signal generation circuitry, and a system including such a transmitter, such a receiver, and a link (e.g., a single-channel serial link or multi- channel serial link) between the transmitter and receiver.

In another class of embodiments, the invention is a method for measuring phase uniformity of a multi-phase clock set, where the multi-phase clock set is a set of L clocks, each having frequency $f_{dck}$ and each having a different phase $\phi_m$ that satisfies $\phi_m = \phi_{offset} + 2\pi(m/L) + \Delta\phi_m$, where the index "m" is a non-negative integer in the range $\{0, \ldots, L-1\}$ and $\Delta\phi_m$ is an error term, said method including the steps of: (a) generating at least one DC phase difference signal indicative of a phase difference between the clocks of each pair of clocks of a clock pair sequence, where the clock pair sequence is a sequence of pairs of clocks of the multi-phase clock set; and (b) processing the at least one DC phase difference signal to generate an indication of the phase uniformity of the multi-phase clock set. In preferred embodiments, step (a) includes the step of generating one said DC phase difference signal, step (b) includes the step of processing said DC phase difference signal to generate the indication of the phase uniformity of the multi-phase clock set, said DC phase difference signal has a sequence of DC levels (e.g., DC voltage levels), and each of the levels is indicative of the phase difference between the clocks of a different one of the clock pairs of the clock pair sequence. In some embodiments, step (b) includes the steps of generating a sequence of samples of the DC phase difference signal such that each of the samples is indicative of a phase difference between the clocks of one of the clock pairs of the clock pair sequence, and processing the samples to generate data indicative of the phase uniformity of the multi-phase clock set.

In other embodiments, the invention is a method for generating a DC phase difference signal for use in measuring phase uniformity of a multi-phase clock set, where the multi-phase clock set is a set of L clocks, each having frequency $f_{dck}$ and each having a different phase $\phi_m$ that satisfies $\phi_m = \phi_{offset} + 2\pi(m/L) + \Delta\phi_m$, where the index "m" is a non-negative integer in the range $\{0, \ldots, L-1\}$ and $\Delta\phi_m$ is an error term, said method including the steps of: (a) selecting a clock pair sequence, where the clock pair sequence is a sequence of pairs of the clocks of the multi-phase clock set; and (b) generating the DC phase difference signal in such a manner that said DC phase difference signal is indicative of a phase difference between the clocks of each of the pairs of the clocks in the clock pair sequence. In some such embodiments, step (b) includes the step of generating the DC phase difference signal such that said DC phase difference signal has a sequence of DC levels (e.g., DC voltage levels), and each of the levels is indicative of the phase difference between the clocks of a different one of the pairs of the clocks in the clock pair sequence.

DETAILED DESCRIPTION OF PREFERRED EMBODIMENTS

The expression "serial link" is used herein to denote a serial link (having any number of channels) or a channel of a serial link, where the term "channel" of a serial link denotes a portion of the link that is employed to transmit data (or a clock) in serial fashion (e.g., a conductor or conductor pair of a serial link between a transmitter and receiver over which data are transmitted serially, either differentially or in single-ended fashion).

In a class of embodiments, the inventive circuit includes DC signal generation circuitry and multiplexer circuitry coupled to the DC signal generation circuitry. The multiplexer circuitry is coupled and configured to assert to the DC signal generation circuitry any selected one of a number of pairs of clocks of a multi-phase clock set. The DC signal generation circuitry is configured to generate a DC phase difference signal in response to each pair of clocks asserted thereto.

The multi-phase clock set is a set of L clocks (L=12 or L=10, for example), each having frequency $f_{dck}$ and each having a different phase (p, that satisfies $\phi_m = \phi_{offset} + 2\pi(m/L) + \Delta\phi_m$ where the index "μm" is a non-negative integer in the range $\{0, \ldots, L-1\}$, and $\Delta\phi_m$ is an error term. Typically $\Delta\phi_m$ is much smaller than the phase increment $2\pi/L$, and the multi-phase clock set is generated to approximate (as closely as is practical) an ideal multi-phase clock set consisting of L clocks, each having frequency $f_{dck}$ and each having a different phase $\phi_m = \phi_{offset} + 2\pi(m/L)$. The clock having phase $\phi_m = \phi_{offset} + 2\pi(m/L) + \Delta\phi_m$ will be denoted as the "m"th clock.

Figure 1:
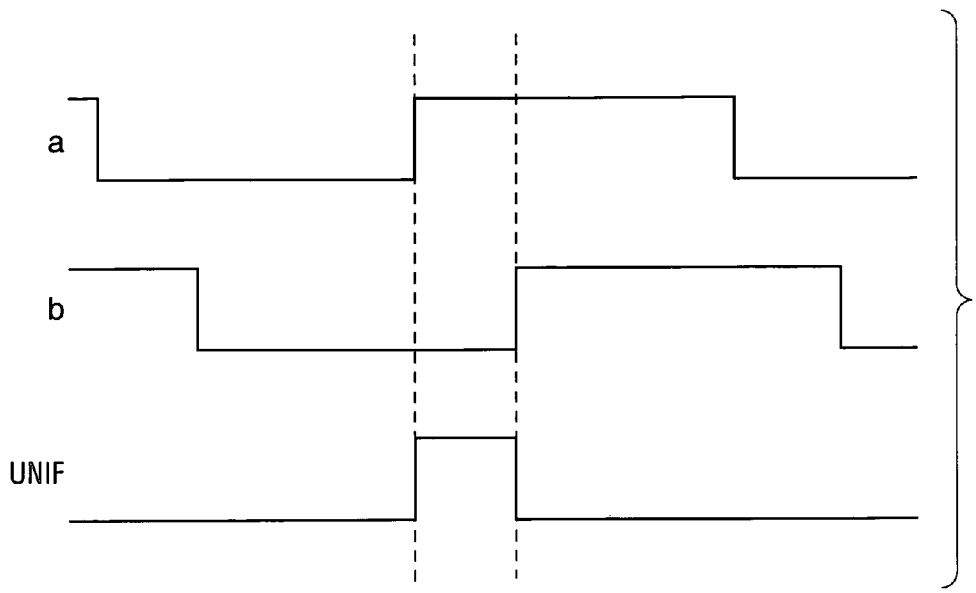
FIG. 1 is a timing diagram of signals asserted in a typical embodiment of the inventive circuit.

In preferred embodiments in the noted class (e.g., the FIG. 2 embodiment to be described below), the error term $\Delta\phi_m$ for each clock is much smaller than the phase increment $2\pi/L$, and the multiplexer circuitry selects clock pairs so that clock phase difference for each clock pair asserted to the DC signal generation circuitry is at least substantially the same for all clock pairs (the phase difference between the clocks of each clock pair is the same except for small errors). To simplify the description of such embodiments, we will denote the clock (in each clock pair) having smaller phase as clock "a," the clock having larger phase as clock "b," the level of clock "a" as "C1," and the level of clock "b" as "C2." Clocks "a" and "b" typically have waveforms as shown in FIG. 1, in which case C1 is high and C2 is low at some times, C1 and C2 are both high at other times, C1 is low and C2 is high at other times, and C1 and C2 are both low at other times. Signal "UNIF" of FIG. 1 has a level Q (at each instant during assertion of clocks "a" and "b") that satisfies Q=k(C1+ (~C2)), where "+" denotes a logical "AND" operation, "~C2" denotes the complement of C2, and "k" is a fixed value. Signal UNIF is periodic with the same period as each of clocks "a" and "b." The DC component of signal UNIF of FIG. 1 is the average level of signal UNIF over an interval of duration not less than one period of the signal.

In the preferred embodiments of the previous paragraph (e.g., the embodiment to be described with reference to FIG. 2), the multiplexer circuitry is configured to assert to the DC signal generation circuitry any selected one of the following clock pairs: the "m"th clock and the "(m+1)"th clock (for each value of m less than L), and the "0"th and "L" th clocks. The phase difference between each pair of clock signals "a" and "b" is determined by generating a binary signal ("UNIF") in response to the clock signals "a" and "b," said binary signal having level Q=k(C1+(~C2)), where C1 is the level of clock "a," C2 is the level of clock "b," and "k" is a fixed value, and generating a signal (referred to herein as a "DC phase difference signal") indicative of the DC component of the binary signal (UNIF). Preferably, the DC phase difference signal is generated by asserting the binary signal (UNIF) to a low pass filter, so that the low pass filter's output is a voltage whose level is the time average of level Q over an interval having duration not less than one clock period (and preferably having duration much longer than one clock period).

Figure 2:
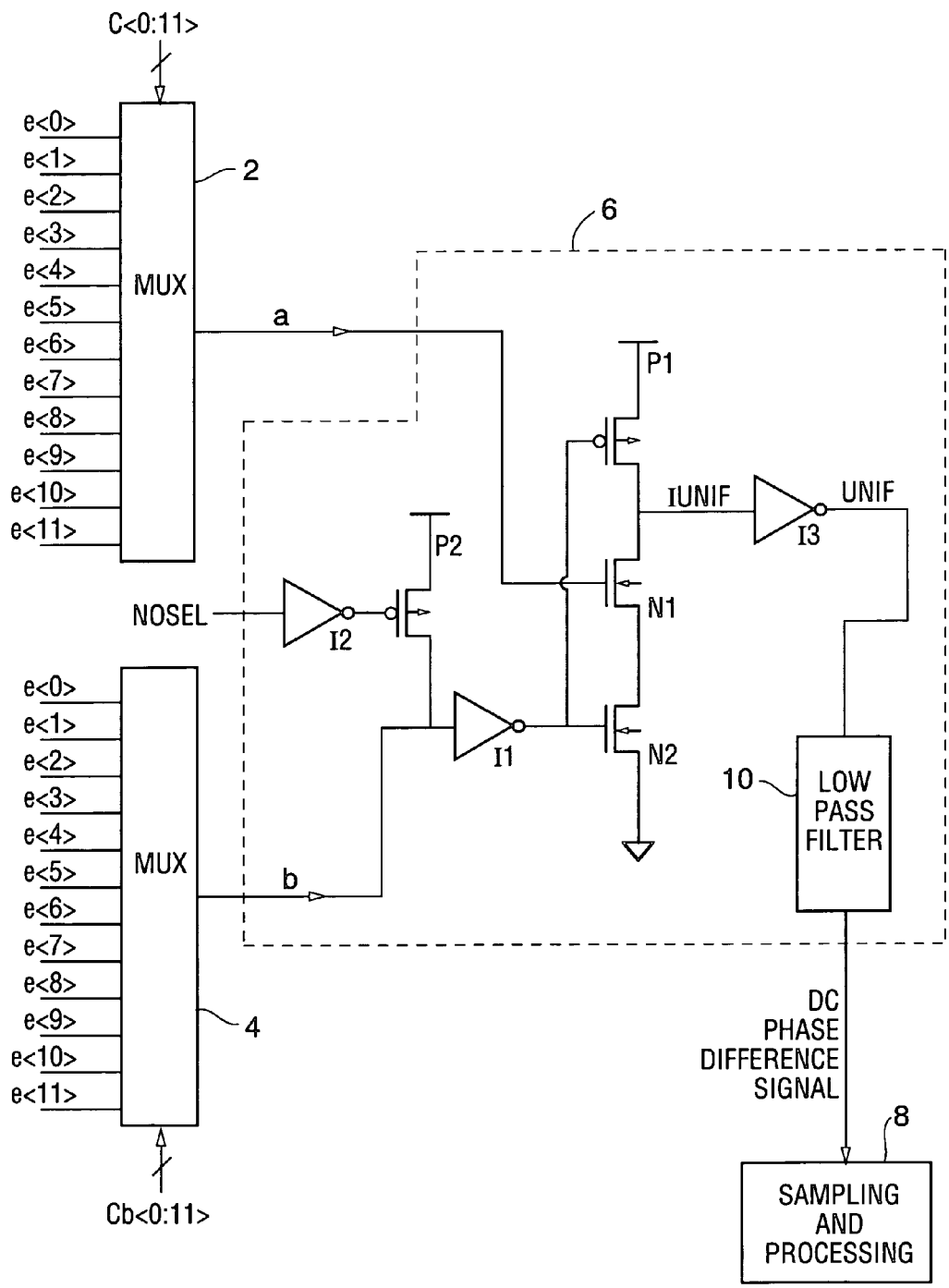
FIG. 2 is a schematic diagram of an embodiment of the inventive circuit.

With reference to FIG. 2, we next describe a preferred embodiment of the inventive circuit. In FIG. 2, the multiplexer circuitry comprising multiplexers 2 and 4 asserts clock signal "a" and clock signal "b" to DC signal generation circuitry 6. The multi-phase clock set asserted to the inputs of the multiplexer circuitry consists of twelve clock signals e<0:11>. Each clock signal of the multi-phase clock set has frequency $f_{dck}$ and each has a different phase $\phi_m = \phi_{offset} + 2(m/6)$, where the index "m" is a non-negative integer in the range {0, . . . , 11}.

Twelve-bit control word c<0:11> determines which of the clock signals e<0:11> is selected by multiplexer 2 as clock signal "a." Twelve-bit control word cb<0:11> determines which of the clock signals e<0:11> is selected by multiplexer 4 as clock signal "b." Multiplexers 2 and 4 are implemented so that only the following pairs of clock signals e<0:11> can be asserted to circuitry 6 at any time as clock signal pair a,b: e<0>, e<1>; e<1>, e<2>; e<2>, e<3>; e<3>, e<4>; e<4>, e<5>; e<5>, e<6>; e<6>, e<7>; e<7>, e<8>; e<8>, e<9>; e<9>, e<10>; e<10>, e<11>; and e<1>, e<0>. Multiplexers 2 and 4 can be implemented as a set of twelve switches, or in any other manner suitable for the intended use.

Each of control words c<0:11> and cb<0:11> is asserted with a selected value while one DC measurement is made on a single clock pair, then each is asserted with a different selected value while another DC measurement is made on a different clock pair, and so on. A four-bit counter, and a 4-to-12 bit decoder coupled to the counter, can be employed to generate control word c<0:11>. Thus, a single binary control bit can be asserted to the counter to cause the counter to assert a sequence of twelve different 4-bit control words to the decoder to cause the decoder to generate the desired sequence of control words c<0:11>. Another four-bit counter with another 4-to-12 bit decoder coupled thereto can similarly be employed to generate control word cb<0:11> (a single binary control bit can be asserted to this counter to cause it to assert a sequence of twelve different 4-bit control words to the decoder to cause the decoder to generate the desired sequence of control words cb<0:11>).

Alternatively, a single four-bit counter and a single 4-to-12 bit decoder are employed in shared fashion to generate a sequence of control word pairs, with each of the control word pairs including one of the words c<0:11> and one of the words cb<0:11>. In one such alternative implementation, each of the words cb<0:11> is a bit-by-bit inverted version of a corresponding one of the words c<0:11>, the decoder generates one word c<0:11> in response to each control word from the counter, and logic circuitry generates one of the words cb<0:11> in response to each word c<0:11>.

The DC phase difference signal generated by circuitry 6 (in response to each clock pair "a, b") is a DC voltage whose level is indicative of the phase difference between the clocks of the clock pair. The DC phase difference signal is asserted to sampling and processing unit 8. Typically, multiplexers 2 and 4 assert a sequence of clock pairs to circuitry 6 (by asserting each clock pair to circuitry 6 for a time interval T) and the DC phase difference signal level settles to a value (indicative of the phase difference of the relevant clock pair) by the end of each time interval T. Unit 8 generates a sequence of samples of the DC phase difference signal (one sample per time interval T) and processes the samples to generate an indication of the phase uniformity of the multi-phase clock set.

For example, unit 8 can generate a sequence of twelve samples of the DC phase difference signal, each sample being indicative of the phase difference, $\phi_m - \phi_n = 2\pi(m-n)/L + \Delta\phi_{mn}$ (where m−n=1 for each index pair m, n), between a different pair of the clocks of the multi-phase clock set. The samples are indicative of the phase difference between each of the clock pairs: e<0>, e<1>; e<1>, e<2>; e<2>, e<3>; e<3>, e<4>; e<4>, e<5>; e<5>, e<6>; e<6>, e<7>; e<7>, e<8>; e<8>, e<9>; e<9>, e<10>; e<10>, e<11>; and e<11>, e<0>. Unit 8 processes the samples to generate data indicative of twelve error term differences $(\Delta\phi_{mn})_i - (\Delta\phi_{mn} - \Delta\phi_{mn})_j = (\phi_m - \phi_n)_i - (\phi_m - \phi_n)_j$, where each index i identifies one of the clock pairs and each index j identifies another of the clock pairs. In the example, a typical implementation of unit 8 processes this data to determine the sum (or average or standard deviation) of the absolute values of the error term differences $(\Delta\phi_{mn})_i - (\Delta\phi_{mn} - \Delta\phi_{mn})_j$ over all (or some) of the twelve pairs of clock pairs. This sum (or average or standard deviation) is a measure of the uniformity of the clock phases of the multi-phase clock set. Alternatively, unit 8 processes the data in another way to generate some measure of the uniformity of the clock phases of the multi-phase clock set, or unit 8 simply outputs the data indicative of the error term differences (since the data itself provide a measure of the uniformity of the clock phases of the multi-phase clock set). In another typical implementation, unit 8 processes the data to determine the difference between the largest and the smallest of the error term differences $(\Delta\phi_{mn})_i - (\Delta\phi_{mn} - \Delta\phi_{mn})_j$ and generates data indicative of this difference.

Unit 8 can include hardware (e.g., hardwired circuitry) configured to perform the described processing operations on the samples of the DC phase difference signal. Alternatively, unit 8 can be configured to perform such operations in software or firmware.

The absolute value of each phase difference measurement, $\phi_m - \phi_n$, is typically not meaningful in itself, for example, because process variations in manufacture of the FIG. 2 circuit can make transistors P1, N1, and N2 (of circuitry 6) faster or slower than expected, thus introducing error into the absolute magnitude of each sample of the DC phase difference signal, and thereby introducing error into the absolute value of each phase difference measurement, $\phi_m - \phi_n$. However, the differences between pairs of the samples would typically not be subject to such errors, so that the measured error term differences $(\Delta\phi_{mn} - \Delta\phi_{mn})$ would typically be meaningful even if the individual phase difference measurements $\phi_m - \phi_n$ are not.

DC signal generation circuitry 6 includes combinational logic for generating a binary signal ("UNIF"), and low pass filter 10 for generating a DC phase difference signal having a level indicative of the level of binary signal UNIF averaged over a time interval of duration greater (and typically much greater) than the period of clock "a" (the period of clock "a" is equal to the period of UNIF).

As shown in FIG. 2, clock "a" is asserted to the gate of NMOS transistor N1. Clock "b" is inverted in CMOS inverter 11, and inverted clock "b" is asserted from the output of inverter 11 to the gate of each of PMOS transistor P1 and NMOS transistor N2. As a result, binary signal ("IUNIF") asserted at common drains of transistors N1 and P1 is the complement of signal UNIF (of FIG. 1) when clocks "a" and "b" have the waveforms, respectively, of clock signals "a" and "b" of FIG. 1. Specifically, transistors N1 and N2 are on, and transistor P1 is off (so that IUNIF is low) when "a" is high and "b" is low, transistor N2 is off and transistors P1 and N1 are on (so that IUNIF is high) when "a" is high and "b" is high, and transistors N1 and N2 are off and transistor P1 is on (so that IUNIF is high) when "a" is low and "b" is high.

By controlling multiplexers 2 and 4 so that clock "b" always has larger phase than clock "a" (as shown in FIG. 1), the state in which "a" and "b" are both low always follows a state in which "a" is low and "b" is high. Thus, IUNIF (at the common drains of transistors N1 and P1) remains high after circuitry 6 undergoes a transition (from its state in which "a" is low and "b" is high) to its state in which "a" and "b" are both low, and UNIF then goes low when circuitry undergoes its next state transition (to the state in which "a" is high and "b" is low).

CMOS inverter 13 inverts binary signal UNIF, to generate binary signal UNIF which is asserted from inverter 13 to the input of low pass filter 10. Thus, the binary signal UNIF at the output of inverter 13 has the same waveform as signal UNIF (of FIG. 1) when clocks "a" and "b" of FIG. 2 have the waveforms of clock signals "a" and "b" of FIG. 1, respectively.

Binary signal UNIF at the output of inverter 13 has level Q=C1+(~C2), where "+" denotes a logical "AND" operation, and "C1" and "C2," respectively, are the levels of clock "a" and clock "b" of FIG. 2.

Control signal "Nosel" is asserted to the input of inverter 12 to disable the output of low pass filter 10 when desired. When "Nosel" is asserted with a high level, PMOS transistor P2 is forced on, thus forcing the output of inverter 11 low (thereby forcing signal UNIF, and the output of low pass filter 10, low). For example, "Nosel" can be asserted with a high level when control signals c<0:11> and cb<0:11> are being used by other circuitry not shown (e.g., for a purpose other than selecting clock pairs) or to place the FIG. 2 circuit in a low power consumption state. In variations on the FIG. 2 embodiment of the invention, circuit elements 12 and P2 are omitted.

In typical implementations of FIG. 2, low pass filter 10 is a simple RC circuit. However, filter 10 can be implemented in any manner suitable for the intended application.

In a typical implementation of FIG. 2, each of inverters 11, 12, and 13 is a CMOS inverter, PMOS transistor P2 has a channel length to width ratio of 0.9μ/0.35μ, PMOS transistor P1 has a channel length to width ratio of 10μ/0.35, and each of NMOS transistors N1 and N2 has a channel length to width ratio of 7.8μ/0.35μ.

In variations on the FIG. 2 embodiment, the phase difference between each pair of clocks a and b asserted to DC signal generation circuitry 6 is constrained so that all have at least substantially the same absolute value, but the sign of each such phase difference is not constrained. Thus the phase difference between the clocks a and b could be at least substantially equal to P or −P, where P is the same for all clock pairs. Of course, the combinational logic of the DC signal generation circuitry of such variations would differ from that shown in FIG. 2.

In variations on the FIG. 2 embodiment, the multi-phase clock set is a set of 12 clocks, each having frequency $f_{dck}$ and each having a different phase $\phi_m$ that satisfies $\phi_m = \phi_{offset} + 2\pi (m/12) + \Delta\phi_m$, each phase difference (measured by the DC signal generation circuitry) between a pair of the clocks satisfies $\phi_m - \phi_n = 2\pi(m-n)/12 + \Delta\phi_{mn}$, where m·n, and the quantity (m−n) is constrained to have the same predetermined value for all clock pairs. However, (m−n) need not equal 1 (as in the above description of the FIG. 2 embodiment) and instead can have another value (e.g., m−n can be equal to 3).

Figure 4:
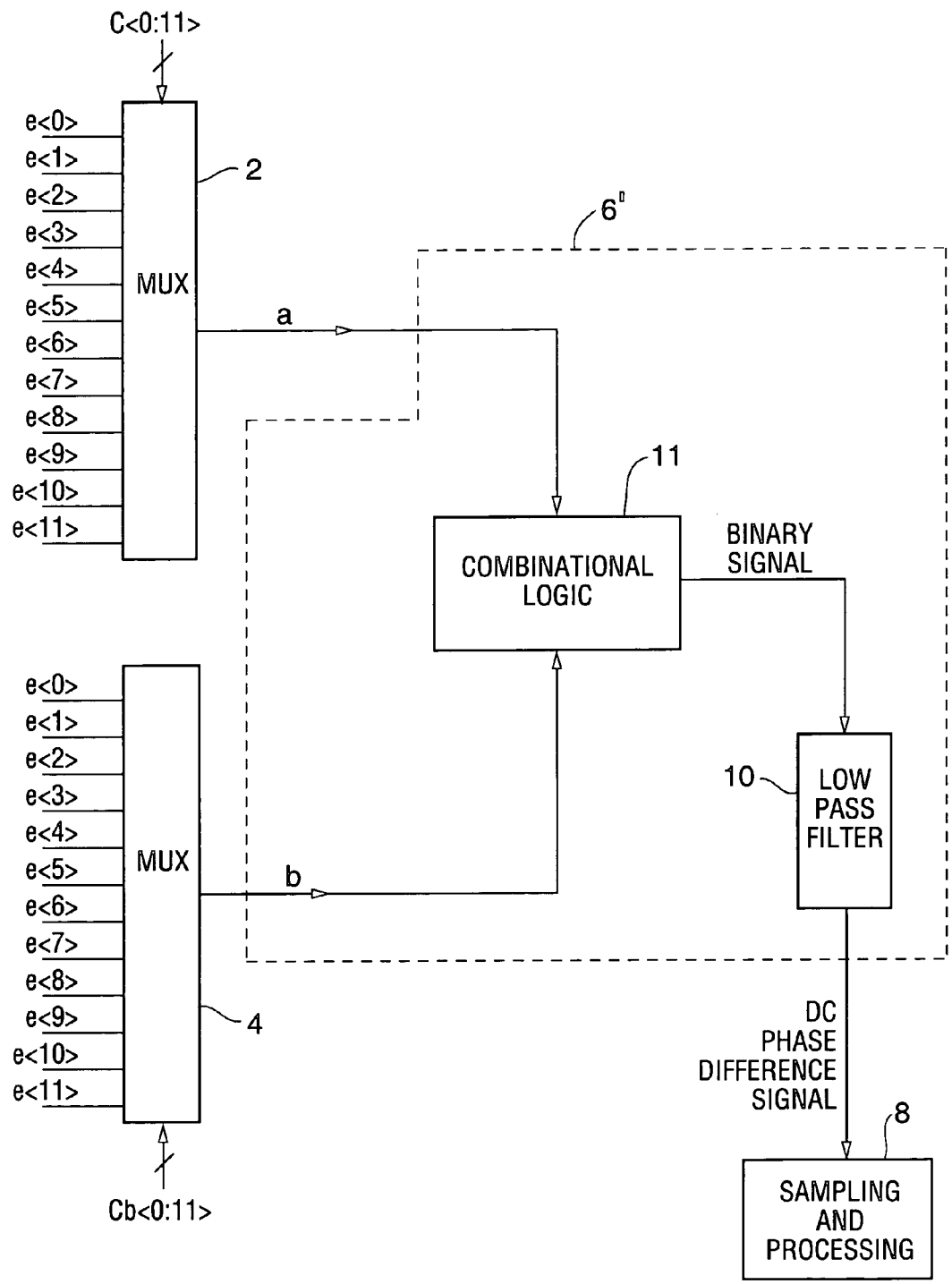
FIG. 4 is a schematic diagram of another embodiment of the inventive circuit.

The FIG. 2 embodiment (and variations thereon which implement logically equivalent functions, e.g., embodiments in which the binary signal is an inverted version of the binary signal UNIF described with reference to FIG. 2) is especially useful for measuring clock phase uniformity of multi-phase clock set in a receiver (or other device) in which the timing from rising edge to rising edge of each clock is the primary concern. In other applications (e.g., for measuring clock phase uniformity of multi-phase clock set in a typical transmitter), the timing between the rising edge of one clock and the falling edge of another clock (e.g., the timing between the falling edge of clock1 and the rising edge of clock3 which has duration equal to about one serial bit width) may be the primary concern. For such other applications, it is typically preferable to employ a variation on the FIG. 2 embodiment rather than the FIG. 2 embodiment itself. The circuit shown in FIG. 4 is one such variation. Elements of the FIG. 4 circuit that are numbered identically to corresponding elements of FIG. 2 are identical to those elements of FIG. 2, and the foregoing description of these elements will not be repeated with reference to FIG. 4. In FIG. 4, combinational logic 11 within circuitry 6' is configured to generate a binary signal in response to each selected clock pair "a,b" asserted at the outputs of multiplexers 2 and 4, such that the binary signal's level at each instant during assertion of a selected clock pair is Q=k(C1+C2), where "+" denotes a logical "AND" operation, "C1" and "C2," respectively, are the levels of clocks "a" and "b" of the selected clock pair, and "k" is a fixed value. This binary signal is low-pass filtered in filter 10 to generate a DC phase difference signal. The DC phase difference signal is asserted to sampling and processing unit 8.

It should be appreciated that in each embodiment of the invention that includes combinational logic and a low pass filter, the combinational logic can be embedded in a chip and the low pass filter can be implemented outside the chip (e.g., at the board level, such as in an ATE test board). Alternatively, both the combinational logic and low pass filter are implemented as elements of a single chip. In other embodiments, the combinational logic and low pass filter are implemented in different chips, or neither the combinational logic nor the low pass filter is implemented as an element of a chip. It is within the scope of the invention to implement the combinational logic and low pass filter in any suitable manner.

Other embodiments of the invention are receivers and transmitters that include any embodiment of the inventive DC signal generation circuitry, and systems including a transmitter, a receiver, and a link (e.g., a multi-channel serial link) between the transmitter and receiver (with at least one of the receivers and transmitters including an embodiment of the inventive DC signal generation circuitry). For example, in the system of FIG. 3, transmitter 20 includes multiplexing and DC signal generation circuitry 32 (which embodies the invention, and can include elements 2, 4, and 6 of FIG. 2), and receiver 22 includes multiplexing and DC signal generation circuitry 38 (which embodies the invention, and can include elements 2, 4, and 6 of FIG. 2).

Figure 3:
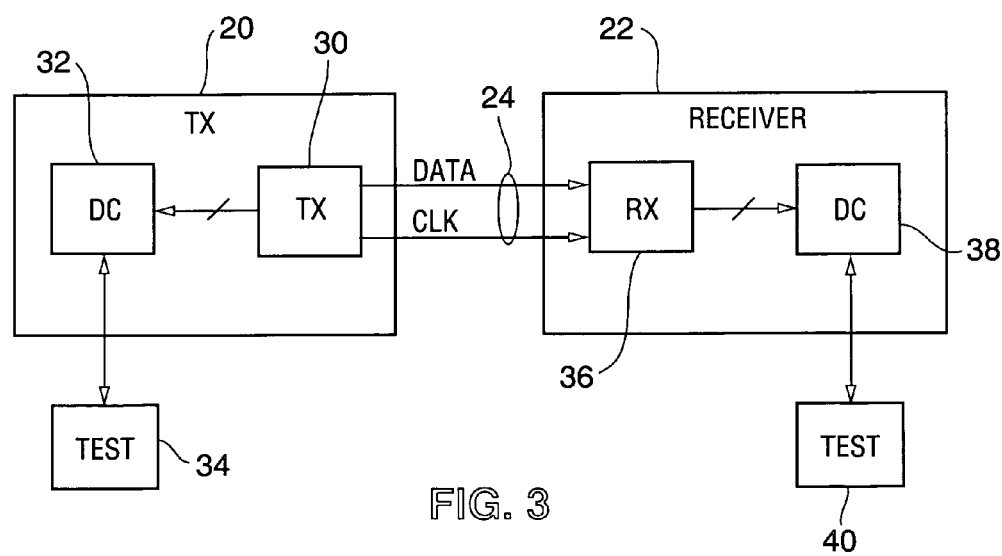
FIG. 3 is a block diagram of a system including a transmitter, a receiver, and a serial link between them, in which each of the transmitter and the receiver embodies the invention.

In the FIG. 3 system, data encoding and transmission circuitry 30 (within transmitter 20) is configured to send encoded data ("DATA") and a clock ("CLK") over multi-channel serial link 24 to receiver 22. Data encoding and transmission circuitry 30 generates a multi-phase clock set for use in encoding data, encodes the raw data for transmission (using the multi-phase clock set), and asserts the encoded data and a clock ("CLK") to link 24. In typical implementations, the transmitted data DATA are (or include) video data, the clock CLK is a pixel clock, the video data are transmitted over one or more video channels of link 24, and the pixel clock is transmitted over a clock channel distinct from each video channel.

In some implementations, the clock CLK has frequency $f_{dck}$ (i.e., its frequency matches the frequency of each clock of the multi-phase clock set employed within circuitry 30) and phase $\phi_{offset}$. In other implementations, the clock CLK has frequency greater or less than $f_{dck}$. For example, in one implementation, circuitry 30 uses a clock having frequency $f_1$ to generate the multi-phase clock set, each clock of the multi-phase clock set has frequency $f_{dck}=A(f_1)$, where A is a constant greater than one (e.g., A=2.5), the clock CLK transmitted by circuitry 30 has frequency $f_1$, and circuitry 36 in receiver 22 generates a second multi-phase clock set (each clock of which has frequency $f_{dck}=A(f_1)$) in response to the transmitted clock CLK. The ratio between the input (or reference) clock employed to generate each multi-phase clock set, and the frequency of each clock of the multi-phase clock set, can be an integer or a rational number or a randomly changing number depending on the specific application. Having an integer or rational number ratio between input clock frequency and multi-phase clock frequency is common in present-day applications, but a randomly varying relationship is also becoming popular in applications such as fractional-n clock synthesis.

In variations on the FIG. 3 system, multi-channel serial link 24 is replaced by a single-channel serial link, and a modified version of transmitter 20 is configured to send encoded data and a clock over the link to a modified version of receiver 22. The transmitted clock is embedded in the transmitted data stream. The receiver is configured to recover the transmitted clock and to generate a multi-phase clock set (each clock of which has frequency $f_{dck}$) in response to the recovered clock.

Circuitry 30 can be implemented to generate the multi-phase clock set in response to a principal clock having a frequency which is not equal to the frequency ($f_{dck}$) of the clocks of the multi-phase clock set. In such implementations, the clock CLK transmitted over link 24 can have frequency $f_{dck}$ and can be one of the clocks of the multi-phase clock set, or the clock CLK can be the principal clock or some other clock. Circuitry 30 uses the multi-phase clock set to transmit the encoded data (at a data rate greater than the frequency $f_{dck}$) to receiver 22 via link 24.

Decoding and receiving circuitry within receiver 22 generates a second multi-phase clock set in response to the clock (CLK) received over link 24, and uses the second multi-phase clock set to recover and decode the data received over link 24.

Circuitry 30 asserts the multi-phase clock set to multiplexing and DC signal generation circuitry 32. Circuitry 32 includes multiplexing circuitry and DC signal generation circuitry, and the multiplexing circuitry operates to assert a sequence of clock pairs (of the multi-phase clock set) to the DC signal generation additional circuitry. The DC signal generation circuitry generates a DC phase difference signal in response to the sequence of clock pairs. The DC phase difference signal has a level indicative of the phase difference between each clock pair in the sequence. Circuitry 32 either asserts the DC phase difference signal to external test unit 34, or samples the DC phase difference signal and asserts a sequence of the resulting samples to unit 34. Unit 34 processes the samples received from circuitry 32 (or samples generated within unit 34 in response to the DC phase difference signal received from circuitry 32) to generate an indication of the phase uniformity of the multi-phase clock set. Optionally, test unit 34 can be decoupled from transmitter 20. When a typical implementation of unit 34 is coupled to transmitter 20, it operates to assert one or more control signals to circuitry 32 to cause the multiplexing circuitry within circuitry 32 to assert (with appropriate timing) a desired sequence of clock pairs (of the multi-phase clock set) to the DC signal generation circuitry within circuitry 32.

Similarly, circuitry 36 (of receiver 22) asserts the second multi-phase clock set generated therein to multiplexing and DC signal generation circuitry 38. Circuitry 38 includes multiplexing circuitry and DC signal generation circuitry, and the multiplexing circuitry operates to assert a sequence of clock pairs (of the second multi-phase clock set) to the DC signal generation additional circuitry. The DC signal generation circuitry generates a DC phase difference signal in response to the sequence of clock pairs. The DC phase difference signal has a level indicative of the phase difference between each clock pair in the sequence. Circuitry 38 either asserts the DC phase difference signal to external test unit 40, or samples the DC phase difference signal and asserts a sequence of the resulting samples to unit 40. Unit 40 processes the samples received from circuitry 38 (or samples generated within unit 40 in response to the DC phase difference signal received from circuitry 38) to generate an indication of the phase uniformity of the second multi-phase clock set. Optionally, test unit 40 can be decoupled from receiver 22. When a typical implementation of unit 40 is coupled to receiver 22, it operates to assert one or more control signals to circuitry 38 to cause the multiplexing circuitry within circuitry 38 to assert (with appropriate timing) a desired sequence of clock pairs (of the second multi-phase clock set) to the DC signal generation circuitry within circuitry 38.

Each of units 34 and 40 can include hardware (e.g., hardwired circuitry) configured to perform the described processing operation on the samples of the DC phase difference signal. Alternatively, each of units 34 and 40 can be configured to perform such operation in software or firmware.

In another class of embodiments, the invention is a method for measuring phase uniformity of a multi-phase clock set, where the multi-phase clock set is a set of L clocks, each having frequency $f_{dck}$ and each having a different phase $\phi_m$ that satisfies $\phi_m=\phi_{offset}+2\pi(m/L)+\Delta\phi_m$, where the index "m" is a non-negative integer in the range $\{0, \ldots, L-1\}$ and $\Delta\phi_m$ is an error term, said method including the steps of: (a) generating at least one DC phase difference signal indicative of a phase difference between the clocks of each pair of clocks of a clock pair sequence, where the clock pair sequence is a sequence of pairs of clocks of the multi-phase clock set; and (b) processing the at least one DC phase difference signal to generate an indication of the phase uniformity of the multi-phase clock set. In preferred embodiments, step (a) includes the step of generating one said DC phase difference signal, step (b) includes the step of processing said DC phase difference signal to generate the indication of the phase uniformity of the multi-phase clock set, and the DC phase difference signal has a sequence of DC levels (e.g., DC voltage levels), each of the levels being indicative of the phase difference between the clocks of a different one of the clock pairs of the sequence. In some embodiments, step (b) includes the steps of generating a sequence of samples of the DC phase difference signal such that each of the samples is indicative of a phase difference between the clocks of one of the clock pairs of the sequence, and processing the samples to generate data indicative of the phase uniformity of the multi-phase clock set.

In another class of embodiments, the invention is a method for generating a DC phase difference signal for use in measuring phase uniformity of a multi-phase clock set, where the multi-phase clock set is a set of L clocks, each having frequency $f_{dck}$ and each having a different phase $\phi_m$ that satisfies $\phi_m = \phi_{offset} + 2\pi(m/L) + \Delta\phi_m$, where the index "m" is a non-negative integer in the range $\{0, \ldots, L-1\}$ and $\Delta\phi_m$ is an error term, said method including the steps of: (a) selecting a clock pair sequence, where the clock pair sequence is a sequence of pairs of the clocks of the multi-phase clock set; and (b) generating the DC phase difference signal in such a manner that said DC phase difference signal is indicative of a phase difference between the clocks of each of the pairs of the clocks in the clock pair sequence. In some such embodiments, step (b) includes the step of generating the DC phase difference signal such that said DC phase difference signal has a sequence of DC levels (e.g., DC voltage levels), and each of the levels is indicative of the phase difference between the clocks of a different one of the pairs of the clocks in the clock pair sequence.

It should be understood that while some embodiments of the present invention are illustrated and described herein, the invention is defined by the claims and is not to be limited to the specific embodiments described and shown.

What is claimed is:

1. A system for measuring phase uniformity of a multi-phase clock set, where the multi-phase clock set is a set of L clocks, each having frequency $f_{dck}$ and each having a different phase $\phi_m$ that satisfies $\phi_m = \phi_{offset} + 2\pi(m/L) + \Delta\phi_m$, index "m" is a non-negative integer in the range $\{0, \ldots, L-1\}$, $\phi_{offset}$ is a phase, and $\Delta\phi_{m3}$ is an error term, said system including:

DC phase difference signal generation circuitry, coupled and configured to generate at least one DC phase difference signal in response to a clock pair sequence, wherein the clock pair sequence is a sequence of pairs of the clocks of the multi-phase clock set, and the at least one DC phase difference signal is indicative of the phase difference between the clocks of each of the pairs of the clocks in the clock pair sequence;

means for processing the at least one DC phase difference signal to generate an indication of the phase uniformity of the multi-phase clock set; and multiplexer circuitry having first inputs coupled to receive at least some of the clocks of the multi-phase clock set, second inputs coupled to receive at least some of the clocks of the multi-phase clock set, and a pair of outputs coupled to the DC phase difference signal generation circuitry, wherein the multiplexer circuitry is configured to assert to the outputs any selected one of the clocks received at the first inputs and any selected one of the clocks received at the second inputs.

2. The system of claim 1, wherein the first inputs are coupled to receive all the clocks of the multi-phase clock set, and the second inputs are coupled to receive all the clocks of the multi-phase clock set.

3. A system for measuring phase uniformity of a multi-phase clock set, where the multi-phase clock set is a set of L clocks, each having frequency $f_{dck}$ and each having a different phase $\phi_m$ that satisfies $\phi_m = \phi_{offset} + 2\pi(m/L) + \Delta\phi_m$ index "m" is a non-negative integer in the range $\{0, \ldots, L-1\}$, $\phi_{offset}$ is a phase, and $\Delta\phi_m$ is an error term, said system including:

DC phase difference signal generation circuitry, coupled and configured to generate at least one DC phase difference signal in response to a clock pair sequence, wherein the clock pair sequence is a sequence of pairs of the clocks of the multi-phase clock set, and the at least one DC phase difference signal is indicative of the phase difference between the clocks of each of the pairs of the clocks in the clock pair sequence; and means for processing the at least one DC phase difference signal to generate an indication of the phase uniformity of the multi-phase clock set, wherein the DC phase difference signal generation circuitry includes:

combinational logic configured to generate at least one binary signal in response to the clock pair sequence; and at least one low pass filter coupled to the combinational logic and configured to generate the at least one DC phase difference signal in response to the at least one binary signal.

4. A system for measuring phase uniformity of a multi-phase clock set, where the multi-phase clock set is a set of L clocks, each having frequency $f_{dck}$ and each having a different phase that satisfies $\phi_m = \phi_{offset} + 2\pi(m/L) + \Delta\phi_m$, index "m" is a non-negative integer in the range $\{0, \ldots, L-1\}$, $\phi_{offset}$ is a phase, and $\Delta\phi_m$ is an error term, said system including:

DC phase difference signal generation circuitry, coupled and configured to generate at least one DC phase difference signal in response to a clock pair sequence, wherein the clock pair sequence is a sequence of pairs of the clocks of the multi-phase clock set, and the at least one DC phase difference signal is indicative of the phase difference between the clocks of each of the pairs of the clocks in the clock pair sequence; and means for processing the at least one DC phase difference signal to generate an indication of the phase uniformity of the multi-phase clock set, wherein the DC phase difference signal generation circuitry is configured to generate one said DC phase difference signal in response to the clock pair sequence, and the DC phase difference signal has a sequence of levels indicative of the phase difference between the clocks of each of the pairs of the clocks in the clock pair sequence, and wherein the DC phase difference signal generation circuitry includes:

combinational logic configured to generate a binary signal in response to the clock pair sequence; and a low pass filter coupled to receive the binary signal and configured to generate the DC phase difference signal in response to the binary signal.

5. The system of claim 4, wherein each of the pairs of the clocks in the clock pair sequence includes a first clock and a second clock, and the combinational logic includes:
   first circuitry configured to generate an inverted clock by inverting the second clock; and
   second circuitry coupled to the first circuitry and configured to generate the binary signal, including by performing a logical "AND" operation on the first clock and the inverted clock.

6. The system of claim 4, wherein each of the pairs of the clocks in the clock pair sequence includes a first clock and a second clock, and the binary signal has a level at least substantially equal to $Q=k(C1+(\sim C2))$ at each time during assertion of the first clock and the second clock, where "+" denotes a logical "AND" operation, C1 is the level of the first clock, C2 is the level of the second clock, "$\sim$C2" denotes the complement of C2, and "k" is a fixed value.

7. The system of claim 4, wherein each of the pairs of the clocks in the clock pair sequence includes a first clock and a second clock, and the binary signal has a level at least substantially equal to $Q=k(C1+C2)$ at each time during assertion of the first clock and the second clock, where "+" denotes a logical "AND" operation, C1 is the level of the first clock, C2 is the level of the second clock, and "k" is a fixed value.

8. A system for measuring phase uniformity of a multi-phase clock set, where the multi-phase clock set is a set of L clocks, each having frequency $f_{dck}$ and each having a different phase $\phi_m$ that satisfies $\phi_m = \phi_{offset} + 2\pi(m/L) + \Delta\phi_m$, index "m" is a non-negative integer in the range $\{0, \ldots, L-1\}$, offset is a phase, and $\Delta\phi_m$, is an error term, said system including:
   DC phase difference signal generation circuitry, coupled and configured to generate at least one DC phase difference signal in response to a clock pair sequence, wherein the clock pair sequence is a sequence of pairs of the clocks of the multi-phase clock set, and the at least one DC phase difference signal is indicative of the phase difference between the clocks of each of the pairs of the clocks in the clock pair sequence; and
   means for processing the at least one DC phase difference signal to generate an indication of the phase uniformity of the multi-phase clock set,
   wherein the DC phase difference signal generation circuitry is configured to generate one said DC phase difference signal in response to the clock pair sequence, and the DC phase difference signal has a sequence of levels indicative of the phase difference between the clocks of each of the pairs of the clocks in the clock pair sequence, and wherein the means for processing is configured to generate a sequence of samples of the DC phase difference signal.

9. The system of claim 8, wherein the means for processing is also configured to process the samples to generate data indicative of the phase uniformity of the multi-phase clock set.

10. The system of claim 8, wherein each of the samples is indicative of a phase difference, $\phi_m - \phi_n = 2\pi(m-n)/L + \Delta\phi_{mn}$ where each of indices "m" and "n" is a non-negative integer in the range $\{0, \ldots, L-1\}$, m−n= V for each index pair m, n, where V is a fixed value, and the means for processing is configured to generate data indicative of error term differences $(\Delta\phi_{mn})_i - (\Delta\phi_{mn})_j = (\phi_m - \phi_n)_i - (\phi_m - \phi_n)_j$, where each index i identifies one of the clock pairs of the clock pair sequence and each index j identifies another of the clock pairs of the clock pair sequence.

11. The system of claim 10, wherein the means for processing is also configured to generate data indicative of the phase uniformity of the multi-phase clock set are data indicative of an average of the absolute values of the error term differences $(\Delta\phi_{mn})_i - (\Delta\phi_{mn})_j$ over at least some of the clock pairs of the clock pair sequence.

12. The system of claim 10, wherein the means for processing is also configured to generate data indicative of the phase uniformity of the multi-phase clock set are data indicative of the standard deviation of the absolute values of the error term differences $(\Delta\phi_{mn})_i - (\Delta\phi_{mn})_j$ over at least some of the clock pairs of the clock pair sequence.

13. The system of claim 10, wherein the means for processing is also configured to generate data indicative of the phase uniformity of the multi-phase clock set are data indicative of the difference between a largest one of the error term differences $(\Delta\phi_{mn})i - (\Delta\phi_{mn})_j$ and a smallest one of the error term differences $(\Delta\phi_{mn})i - (\Delta\phi_{mn})_j$.

14. The system of claim 10, wherein the data indicative of the error term differences $(\Delta\phi_{mn})i - (\Delta\phi_{mn})_j$ is said indication of the phase uniformity of the multi-phase clock set.

15. The system of claim 10, wherein V=1.

16. The system of claim 10, wherein V=3.

17. A circuit for generating a DC phase difference signal for use in measuring phase uniformity of a multi-phase clock set, where the multi-phase clock set is a set of L clocks, each having frequency $f_{dck}$ and each having a different phase $\phi_m$ that satisfies $\phi_m = \phi_{offset} + 2\pi(m/L) + \Delta\phi_m$, index "m" is a non-negative integer in the range $\{0, \ldots, L-1\}$, $\phi_{offset}$ is a phase, and $\Delta\phi_m$ is an error term, said circuit including:
   multiplexer circuitry having inputs coupled to receive at least some of the clocks of the multi-phase clock set and a pair of outputs, wherein the multiplexer circuitry is configured to assert a clock pair sequence to the outputs, the clock pair sequence is a sequence of pairs of the clocks of the multi-phase clock set, and each of said pairs of the clocks is a selected pair of the clocks received at the inputs; and
   DC phase difference signal generation circuitry, having inputs coupled to the outputs of the multiplexer circuitry, and configured to generate the DC phase difference signal in response to the clock pair sequence such that the DC phase difference signal is indicative of a phase difference between the clocks of each of the pairs of the clocks in the clock pair sequence.

18. The circuit of claim 17, wherein the inputs of the multiplexer circuitry are coupled to receive all the clocks of the multi-phase clock set.

19. The circuit of claim 17, wherein the DC phase difference signal has a sequence of levels, and each of the levels is a DC voltage level indicative of the phase difference between the clocks of a different one of the pairs of the clocks in the clock pair sequence.

20. The circuit of claim 17, wherein the DC phase difference signal generation circuitry includes:
   combinational logic configured to generate a binary signal in response to the clock pair sequence; and
   a low pass filter coupled to receive the binary signal and configured to generate the DC phase difference signal in response to the binary signal.

21. The circuit of claim 20, wherein each of the pairs of the clocks in the clock pair sequence includes a first clock and a second clock, and the combinational logic includes:
   first circuitry configured to generate an inverted clock by inverting the second clock; and second circuitry coupled to the first circuitry and configured to generate the binary signal, including by performing a logical "AND" operation on the first clock and the inverted clock.

22. The circuit of claim 20, wherein each of the pairs of the clocks in the clock pair sequence includes a first clock and a second clock, and the binary signal has a level at least substantially equal to Q=k(C1+(~C2)) at each time during assertion of the first clock and the second clock, where "+" denotes a logical "AND" operation, C1 is the level of the first clock, C2 is the level of the second clock, "~C2" denotes the complement of C2, and "k" is a fixed value.

23. The circuit of claim 20, wherein each of the pairs of the clocks in the clock pair sequence includes a first clock and a second clock, and the binary signal has a level at least substantially equal to Q=k(C1+C2) at each time during assertion of the first clock and the second clock, where "+" denotes a logical "AND" operation, C1 is the level of the first clock, C2 is the level of the second clock, and "k" is a fixed value.

24. A system, comprising:
a transmitter;
a receiver; and
a link coupled between the transmitter and the receiver, wherein the transmitter is configured to generate data using a multi-phase clock set, and to transmit the data and a reference clock over the link to the receiver, where the multi-phase clock set is a set of L clocks, each having frequency $f_{dck}$ and each having a different phase $\phi_m$ that satisfies $\phi_m = \phi_{offset} + 2\pi(m/L) + \Delta\phi_m$, index "m" is a non-negative integer in the range $\{0, \ldots, L-1\}$, $\phi_{offset}$ is a phase, and $\Delta\phi_m$ is an error term,
the receiver is configured to receive the data and the reference clock, and to generate a second multi-phase clock set in response to said reference clock, and
the transmitter includes:
a circuit for generating a DC phase difference signal for use in measuring phase uniformity of the multi-phase clock set, said circuit for generating the DC phase difference signal including:
multiplexer circuitry having inputs coupled to receive at least some of the clocks of the multi-phase clock set and a pair of outputs, wherein the multiplexer circuitry is configured to assert a clock pair sequence to the outputs, the clock pair sequence is a sequence of pairs of the clocks of the multi-phase clock set, and each of said pairs of the clocks is a selected pair of the clocks received at the inputs; and
DC phase difference signal generation circuitry, having inputs coupled to the outputs of the multiplexer circuitry, and configured to generate the DC phase difference signal in response to the clock pair sequence such that the DC phase difference signal is indicative of a phase difference between the clocks of each of the pairs of the clocks in the clock pair sequence.

25. The system of claim 24, wherein the reference clock is one of the clocks of the multi-phase clock set.

26. The system of claim 24, wherein the DC phase difference signal has a sequence of levels, and each of the levels is a DC voltage level indicative of the phase difference between the clocks of a different one of the pairs of the clocks in the clock pair sequence.

27. The system of claim 24, wherein the DC phase difference signal generation circuitry includes:
combinational logic configured to generate a binary signal in response to the clock pair sequence; and
a low pass filter coupled to receive the binary signal and configured to generate the DC phase difference signal in response to the binary signal.

28. The system of claim 24, wherein the link is a multi-channel serial link, and the transmitter is configured to transmit the data over at least one channel of the link to the receiver and to transmit said reference clock over another channel of the link to the receiver.

29. A system, comprising:
a transmitter;
a receiver; and
a link coupled between the transmitter and the receiver, wherein the transmitter is configured to generate data using a multi-phase clock set, and to transmit the data and a reference clock over the link to the receiver,
the receiver is configured to receive the data and the reference clock, and to generate a second multi-phase clock set in response to said reference clock, where the second multi-phase clock set is a set of L clocks, each having frequency $f_{dck}$ and each having a different phase $\phi_m$ that satisfies $\phi_b = \phi_{offset} + 2\pi(m/L) + \Delta\phi_m$, index "m" is a non-negative integer in the range $\{0, \ldots, L-1\}$, $\phi_{offset}$ is a phase, and $\Delta\phi_m$ is an error term, and
the receiver includes:
a circuit for generating a DC phase difference signal for use in measuring phase uniformity of the second multi-phase clock set, said circuit for generating the DC phase difference signal including:
multiplexer circuitry having inputs coupled to receive at least some of the clocks of the second multi-phase clock set and a pair of outputs, wherein the multiplexer circuitry is configured to assert a clock pair sequence to the outputs, the clock pair sequence is a sequence of pairs of the clocks of the second multi-phase clock set, and each of said pairs of the clocks is a selected pair of the clocks received at the inputs; and
DC phase difference signal generation circuitry, having inputs coupled to the outputs of the multiplexer circuitry, and configured to generate the DC phase difference signal in response to the clock pair sequence such that the DC phase difference signal is indicative of a phase difference between the clocks of each of the pairs of the clocks in the clock pair sequence.

30. The system of claim 29, wherein the reference clock is one of the clocks of the multi-phase clock set.

31. The system of claim 29, wherein the DC phase difference signal has a sequence of levels, and each of the levels is a DC voltage level indicative of the phase difference between the clocks of a different one of the pairs of the clocks in the clock pair sequence.

32. The system of claim 29, wherein the DC phase difference signal generation circuitry includes:
combinational logic configured to generate a binary signal in response to the clock pair sequence; and
a low pass filter coupled to receive the binary signal and configured to generate the DC phase difference signal in response to the binary signal.

33. A receiver configured to receive data and a reference clock, and to generate a multi-phase clock set in response to the reference clock, where the multi-phase clock set is a set of L clocks, each having frequency $f_{dck}$ and each having a different phase $\phi_m$ that satisfies $\phi_m = \phi_{offset} + 2\pi(m/L) + \Delta\phi_m$, index "m" is a non-negative integer in the range $\{0, \ldots, L-1\}$, $\phi_{offset}$ is a phase, and $\Delta\phi_m$ is an error term, wherein the receiver includes:
a circuit for generating a DC phase difference signal for use in measuring phase uniformity of the multi-phase clock set, said circuit for generating the DC phase difference signal including:

multiplexer circuitry having inputs coupled to receive at least some of the clocks of the multi-phase clock set and a pair of outputs, wherein the multiplexer circuitry is configured to assert a clock pair sequence to the outputs, the clock pair sequence is a sequence of pairs of the clocks of the multi-phase clock set, and each of said pairs of the clocks is a selected pair of the clocks received at the inputs; and DC phase difference signal generation circuitry, having inputs coupled to the outputs of the multiplexer circuitry, and configured to generate the DC phase difference signal in response to the clock pair sequence such that the DC phase difference signal is indicative of a phase difference between the clocks of each of the pairs of the clocks in the clock pair sequence.

34. The receiver of claim 33, wherein the reference clock is one clock of a second multi-phase clock set, and said reference clock has the frequency $f_{dck}$.

35. The receiver of claim 33, wherein the DC phase difference signal has a sequence of levels, and each of the levels is a DC voltage level indicative of the phase difference between the clocks of a different one of the pairs of the clocks in the clock pair sequence.

36. The receiver of claim 33, wherein the DC phase difference signal generation circuitry includes:

combinational logic configured to generate a binary signal in response to the clock pair sequence; and a low pass filter coupled to receive the binary signal and configured to generate the DC phase difference signal in response to the binary signal.

37. A transmitter configured to generate data using a multi-phase clock set, where the multi-phase clock set is a set of L clocks, each having frequency $f_{dck}$ and each having a different phase $\phi_m$ that satisfies $\phi_m = \phi_{offset} + 2\pi(m/L) + \Delta\phi_m$, index "m" is a non-negative integer in the range $\{0, \ldots, L-1\}$, $\phi_{offset}$ is a phase, and $\Delta\phi_m$ is an error term, wherein the transmitter is also configured to assert the data and a reference clock to a link, and wherein the transmitter includes:

a circuit for generating a DC phase difference signal for use in measuring phase uniformity of the multi-phase clock set, said circuit for generating the DC phase difference signal including:

multiplexer circuitry having inputs coupled to receive at least some of the clocks of the multi-phase clock set and a pair of outputs, wherein the multiplexer circuitry is configured to assert a clock pair sequence to the outputs, the clock pair sequence is a sequence of pairs of the clocks of the multi-phase clock set, and each of said pairs of the clocks is a selected pair of the clocks received at the inputs; and DC phase difference signal generation circuitry, having inputs coupled to the outputs of the multiplexer circuitry, and configured to generate the DC phase difference signal in response to the clock pair sequence such that the DC phase difference signal is indicative of a phase difference between the clocks of each of the pairs of the clocks in the clock pair sequence.

38. The transmitter of claim 27, wherein the reference clock is one of the clocks of the multi-phase clock set.

39. The transmitter of claim 37, wherein the DC phase difference signal has a sequence of levels, and each of the levels is a DC voltage level indicative of the phase difference between the clocks of a different one of the pairs of the clocks in the clock pair sequence.

40. The transmitter of claim 37, wherein the DC phase difference signal generation circuitry includes:

combinational logic configured to generate a binary signal in response to the clock pair sequence; and a low pass filter coupled to receive the binary signal and configured to generate the DC phase difference signal in response to the binary signal.

41. The transmitter of claim 37, wherein the link is a multi-channel serial link, and the transmitter is configured to assert the data to at least one channel of the link and to assert said reference clock to another channel of the link.

42. A method for measuring phase uniformity of a multi-phase clock set, where the multi-phase clock set is a set of L clocks, each having frequency $f_{dck}$ and each having a different phase that satisfies $\phi_m = \phi_{offset} + 2\pi(m/L) + \Delta\phi_m$ index "m" is a non-negative integer in the range $\{0, \ldots L-1\}$ $\phi_{offset}$ is a phase, and $\Delta\phi_m$ is an error term, said method including the steps of:

(a) generating at least one DC phase difference signal indicative of a phase difference between the clocks of each pair of clocks of a clock pair sequence, where the clock pair sequence is a sequence of pairs of clocks of the multi-phase clock set; and (b) processing the at least one DC phase difference signal to generate an indication of the phase uniformity of the multi-phase clock set, wherein step (a) includes the step of generating one said DC phase difference signal, and step (b) includes the steps of:

processing said DC phase difference signal to generate the indication of the phase uniformity of the multi-phase clock set, and said DC phase difference signal has a sequence of levels, each of the levels being a DC voltage level indicative of the phase difference between the clocks of a different one of the clock pairs of the clock pair sequence, and generating a sequence of samples of the DC phase difference signal such that each of the samples is indicative of a phase difference between the clocks of one of the clock pairs of the clock pair sequence.

43. The method of claim 42, wherein each of the samples is indicative of a phase difference, $\phi_m - \phi_n = 2\pi(m-n)/L + \Delta\phi_{mn}$ where each of indices "m" and "n" is a non-negative integer in the range $\{0, \ldots, L-1\}$, m−n=V for each index pair m, n, and V is a fixed value, and step (b) includes the step of:

generating data indicative of error term differences $(\Delta\phi_{mn})i - (\Delta\phi_{mn})j = (\phi_m - \phi_n)_i - (\phi_m - \phi_n)_j$, where each index i identifies one of the clock pairs of the clock pair sequence and each index j identifies another of the clock pairs of the clock pair sequence.

44. The method of claim 43, wherein step (b) also includes the step of processing the samples to generate data indicative of the phase uniformity of the multi-phase clock set, and the data indicative of the phase uniformity of the multi-phase clock set are data indicative of an average of the absolute values of the error term differences $(\Delta\phi_{mn})i - (\Delta\phi_{mn})j$ over at least some of the clock pairs of the clock pair sequence.

45. The method of claim 43, wherein step (b) also includes the step of processing the samples to generate data indicative of the phase uniformity of the multi-phase clock set, and the data indicative of the phase uniformity of the multi-phase clock set are data indicative of the standard deviation of the absolute values of the error term differences $(\Delta\phi_{mn})i-(\Delta\phi_{mn})_j$ over at least some of the clock pairs of the clock pair sequence.

46. The method of claim 43, wherein step (b) also includes the step of processing the samples to generate data indicative of the phase uniformity of the multi-phase clock set, and the data indicative of the phase uniformity of the multi-phase clock set are data indicative of the difference between a largest one of the error term differences $(\Delta\phi_{mn})i-(\Delta\phi_{mn})_j$ and a smallest one of the error term differences $(\Delta\phi_{mn})i-(\Delta\phi_{mn})_j$.

47. The method of claim 43, wherein step (b) also includes the step of processing the samples to generate data indicative of the phase uniformity of the multi-phase clock set, and the data indicative of the phase uniformity of the multi-phase clock set are the data indicative of the error term differences $(\Delta\phi_{mn})i-(\Delta\phi_{mn})_j$.

48. The system of claim 43, wherein V=1.
49. The system of claim 43, wherein V=3.

* * * * *

UNITED STATES PATENT AND TRADEMARK OFFICE
CERTIFICATE OF CORRECTION

PATENT NO. : 7,031,858 B1
APPLICATION NO. : 10/439446
DATED : April 18, 2006
INVENTOR(S) : Eric Lee et al.

It is certified that error appears in the above-identified patent and that said Letters Patent is hereby corrected as shown below:

In Column 14, line 13, "$(\Delta\varphi_m)_i$" should be --$(\Delta\varphi_{mn})_i$--.

In Column 16, line 21, "$\varphi_b$" should be --$\varphi_m$--.

In Column 18, line 46-47, "$(\Delta\varphi_{mn})i$" should be --$(\Delta\varphi_{mn})_i$--.

In Column 18, line 56, "$(\Delta\varphi_{mn})i$" should be --$(\Delta\varphi_{mn})_i$--.

In Column 19, line 1, "$(\Delta\varphi_{mn})i$" should be --$(\Delta\varphi_{mn})_i$--.

In Column 19, line 8, "$(\Delta\varphi_{mn})i$" should be --$(\Delta\varphi_{mn})_i$--.

In Column 19, line 10, "$(\Delta\varphi_{mn})i$" should be --$(\Delta\varphi_{mn})_i$--.

In Column 20, line 6, "$(\Delta\varphi_{mn})i$" should be --$(\Delta\varphi_{mn})_i$--.

Signed and Sealed this

Eleventh Day of July, 2006

JON W. DUDAS
*Director of the United States Patent and Trademark Office*